United States Patent

Sekine et al.

[15] 3,665,341

[45] May 23, 1972

[54] TEMPERATURE COMPENSATED CAVITY FOR A SOLID STATE OSCILLATOR

[72] Inventors: Kenji Sekine, Hachioji; Yoichi Kaneko, Kokubunji, both of Japan

[73] Assignee: Hitachi, Ltd., Tokyo, Japan

[22] Filed: Jan. 20, 1971

[21] Appl. No.: 107,944

[52] U.S. Cl. ............................331/107 R, 331/96, 331/176, 333/82 BT

[51] Int. Cl. ..........................................................H03b 7/14

[58] Field of Search..................331/107, 176, 96; 333/82 BT

*Primary Examiner*—John Kominski
*Attorney*—Craig, Antonelli & Hill

[57] ABSTRACT

A temperature compensated cavity for a solid state oscillator in which part of the conductive plates forming the cavity resonator is constituted by a movable plate, said movable plate being secured to one end of a dielectric rod having a large coefficient of linear expansion, the end of which is supported extensibly, and the other end of which is secured to the extended part of said cavity resonator.

8 Claims, 2 Drawing Figures

INVENTORS
KENJI SEKINE AND YOICHI KANEKO
BY
Craig, Antonelli, Stewart + Hill
ATTORNEYS

TEMPERATURE COMPENSATED CAVITY FOR A SOLID STATE OSCILLATOR

This invention relates to a temperature compensated cavity for a solid state oscillator and more particularly to a temperature compensated cavity for a solid state oscillator capable of stabilizing the oscillation frequency of the solid state oscillator which tends to be greatly changed by temperature variation.

BACKGROUND OF THE INVENTION

The conventional solid state oscillator, such as, for example, one using a Gunn diode, oscillates at an oscillation frequency which depends upon the dimensions of the Gunn diode, the bias voltage applied thereto, etc. However, the oscillation frequency is also changed due to variations in the ambient temperature, rise in the temperature of the oscillator in operation, and other factors. Such frequency variations are ascribable to the thermal deformation in the cavity resonator and variations in the temperature characteristics of the Gunn diode. However, frequency variations due to change in diode characteristics are much more remarkable than those resulting from cavity deformation. For example, in the case of a 13 GHz solid state oscillator using a Gunn diode, the frequency variation due to thermal deformation in the cavity itself is as small as about 0.21 MHz/°C; whereas, its frequency variation due to changes in the temperature characteristic of the Gunn diode is as great as about 1 MHz/°C. Frequency variation of the solid state oscillator is in substantially linear relationship with temperature variation, and a major portion thereof is caused by variation in the temperature characteristics of the Gunn diode.

To compensate for the frequency variation which is caused by temperature variation in an electron tube, such as a klystron, it is well-known in the art that this frequency variation resulting from thermal deformation in the cavity can be compensated for by utilizing the thermal expansion of a metal element in the cavity. Such a compensation method, though effective when compensating for a small frequency variation due to thermal deformation in the cavity, is not applicable to solid state oscillators whose frequency is variable in a wide range. In the solid state oscillator whose frequency variation is in the range of about $\pm$ 1%, the frequency variation can be compensated for by means of an automatic frequency control system for controlling the oscillation frequency by detecting the frequency deviation and controlling the frequency in accordance therewith. However, to compensate for a frequency variation exceeding the range of about $\pm$ 1%, it is necessary to provide a very complicated automatic frequency control system.

Another frequency compensation method is disclosed in our copending U.S. Pat. application Ser. No. 827,275, filed May 23, 1969. This method relates to a temperature compensated cavity in which a movable piston is disposed in the cavity resonator, one end of a dielectric rod having a large coefficient of linear expansion is secured to the wall of the cavity resonator and the other end to which said movable piston is secured is free, the length of the dielectric rod being changed according to temperature change whereby said piston is moved so that frequency variation due to temperature variation is compensated. In this method, however, the high frequency component tends to leak from the cavity due to the presence of the piston therein and therefore, the high frequency output is reduced. Also, the operation of the oscillator becomes unstable when the movable piston comes into contact with the wall of the cavity resonator. To avoid this, one end of the dielectric rod is secured to the wall of the cavity resonator in such a manner that the piston is not in contact with a side wall of the cavity resonator. With this structure, because the movable piston is held at its one end only, the piston is easily affected by mechanical vibration. Therefore, for example, a force of 3 Gs and vibration of 100 c/s results in a frequency variation of about 4 MHz. In this cavity, two metallic rings are used for the piston, and the thickness of the ring and the distance between the rings are determined to be $\lambda g/4$ ($\lambda g$: guide wavelength), wherein about 20 percent of the high frequency energy leaks by way of the piston as a high frequency loss.

SUMMARY OF THE INVENTION

An object of this invention is to provide a temperature compensated cavity for a solid state oscillator capable of maintaining a substantially constant oscillation frequency and oscillation output irrespective of temperature variation in the cavity.

Another object of this invention is to provide a temperature compensated cavity for a solid state oscillator which provides stable operation even when subjected to mechanical vibration.

Still another object of this invention is to provide a temperature compensated cavity for a solid state oscillator producing less high frequency loss.

To achieve the above objects, a device in accordance with this invention is constructed in such a manner that one end of a dielectric rod having a large coefficient of linear expansion is secured to the wall of the cavity resonator, and the other end of said dielectric rod is provided with a metallic plate covering part of said dielectric rod, a plurality of projections are formed on at least part of the surface of said dielectric rod, and said rod is disposed in the cavity so that projections are brought into contact with the side walls of the cavity resonator and serve to support the rod thereby.

These and other objects, features and advantages of the present invention will become more apparent from the following detailed description when taken with the accompanying drawings, wherein.

DESCRIPTION OF THE PREFERRED EMBODIMENT

Figure 1:
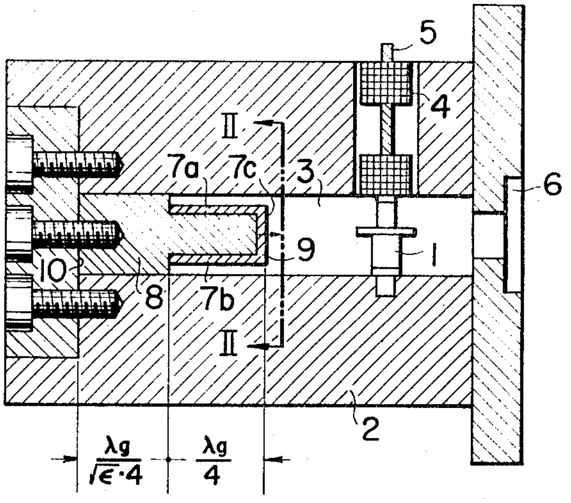
FIG. 1 is a cross-sectional view showing an embodiment of this invention.
Figure 2:
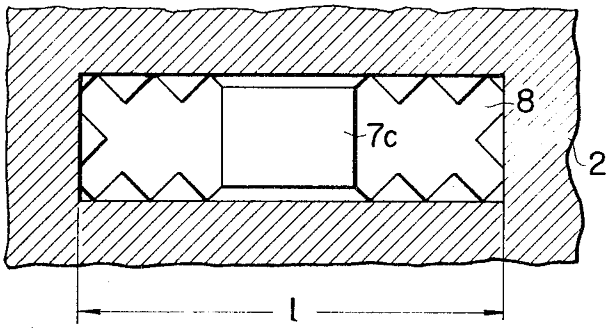
FIG. 2 is an enlarged sectional view taken along line II—II in FIG. 1.

Referring to FIGS. 1 and 2, there is shown an embodiment of this invention, wherein the reference numeral 1 denotes a Gunn diode, or generally a negative resistance oscillating element, 2 designates a cavity resonator, 3 designates a cavity portion, 4 designates a high frequency choke, 5 designates a d. c. bias terminal, and 6 designates an output window.

In the oscillator as arranged above, a d. c. bias voltage is applied to the Gunn diode 1 from the d. c. bias terminal 5 via the high frequency choke 4. The oscillator oscillates at a frequency depending upon the dimensions of the Gunn diode 1 and the value of the bias voltage applied thereto, and the generated output is delivered from the output window 6. The function of the high frequency choke 4 is to prevent leakage of the high frequency energy produced in the cavity 3, and to apply a d. c. bias voltage to the Gunn diode 1. This solid state oscillator is operated in the same manner as in the conventional solid state oscillator.

The metallic plates 7*a*, 7*b*, and 7*c* represent short-circuit pistons, which are inserted into the cavity resonator 2, thus forming the movable wall of the cavity 3. The numeral 8 denotes a dielectric rod having a large coefficient of linear expansion, of which one end is secured to the extended part of the cavity resonator 2 and the other end is equipped with said metallic plates. More specifically, the metallic plates are located in the center part of the cross-sectional plane perpendicular to the axial direction of said cavity resonator in order to increase the short-circuit effect. It is desirable that the width of the metallic plate is determined to be more than one-third the lateral length $l$ (FIG. 2) of the cavity portion 3 of the cavity resonator in order to prevent a large high frequency loss from occurring due to the concentration of electric field if the width of the metallic plate is too narrow. In order to minimize the high frequency leakage, the length from the surface 9 of the metallic plate 7*c* facing the cavity portion 3 to the end 10 of the cavity is determined to be $\lambda g/4 + \lambda g/4\sqrt{\epsilon}$, where $\epsilon$ is the dielectric constant of the dielectric rod 8, and the length of the metallic plate 7*a* and the plate 7*b* is λg/4. A plurality of projections are disposed at the unsecured end of the dielectric rod, as shown in FIG. 2. These projections are in contact with the walls of the cavity resonator and support the dielectric rod 8 extensibly. Instead of the shape of the projections as shown in FIG. 2, any shape may be employed so long as the relative position of the metallic plates 7*a*, 7*b* and 7*c* with respect to the upper and lower walls of the cavity resonator is kept about constant. Also, the metallic plates 7*a* and 7*b* may be omitted when the thickness of the metallic plate 7*c* is determined to be λg/4. In this case, it is merely necessary to bury the metallic plate 7*c* in the end of the dielectric rod 8.

In the device as arranged above, when the temperature in the cavity resonator is raised, the dielectric rod 8 located in the cavity portion 3 is thermally expanded according to its linear thermal expansion coefficient. As a result, the metallic plates 7*a*, 7*b* and 7*c* are pushed in the direction of the arrow toward the oscillating element 1 because one end of the dielectric rod 8 is secured to the end 10 of said cavity. Consequently, the length of the cavity portion 3 is so changed as to decrease the inductance and capacitance of the resonator 2 whereby the increment of the resonant frequency ascribable to the temperature rise is perfectly compensated.

While the high frequency energy produced in the oscillating element 1 leaks via the gap between said pistons, the amount of the leakage energy is as small as 10 percent or less because the length of the metallic plates 7*a* and 7*b* is λg/4 and the length of the part having no metallic plate is $\lambda g/4\sqrt{\epsilon}$.

Furthermore, because the projections are disposed on the surface of the dielectric rod in the area having no metallic plate and are brought into close contact with the walls of the cavity resonator, the oscillator of this invention is very stable against mechanical vibration. For example, the frequency variation in the device of this invention is below 1/10 as small as that of the conventional device having no provision for support. Also, in the device of this invention, the piston can be moved very smoothly by the disclosed arrangement since the projections are brought into point-contact with the walls of the cavity resonator or into linear-contact with the walls thereof in its axial direction.

While we have shown and described one embodiment in accordance with the present invention, it is understood that the same is not limited thereto but is susceptible of numerous changes and modifications as known to a person skilled in the art, and we therefore do not wish to be limited to the details shown and described herein but intend to cover all such changes and modifications as are obvious to one of ordinary skill in the art.

WHAT IS CLAIMED IS:

1. A temperature compensated cavity resonator for a solid state oscillator, comprising a resonant cavity having a movable conductive plate, a solid state oscillating element inserted into said resonant cavity, means for applying a bias voltage to said oscillating element, and a rod-shaped dielectric member having one end secured to a wall of said resonant cavity and the other end thereof supported extensibly within said cavity, a plurality of support projections being provided on the surface of said rod-shaped dielectric member along the length thereof, said projections being in contact with the walls of said cavity resonator, said movable conductive plate being fixed to said other end of the dielectric member in spaced relationship to the walls of said cavity.

2. A temperature compensated cavity resonator for a solid state oscillator as defined in claim 1, in which the width of said movable conductive plate is more than one-third the width of the cavity portion of said resonant cavity.

3. A temperature compensated cavity resonator for a solid state oscillator as defined in claim 1, in which the length of said movable conductive plate is $\lambda_g/4$ in the axial direction of said cavity resonator, where $\lambda_g$ is the wavelength of the cavity, and the length from the surface of said movable conductive plate facing the cavity portion to the secured end of said rod-shaped dielectric member is $\lambda_g/4 + \lambda_g/4\sqrt{\epsilon}$, where $\epsilon$ is the dielectric constant of the rod-shaped dielectric member.

4. A temperature compensated cavity resonator for a solid state oscillator, comprising a resonant cavity of generally rectangular cross section having a movable conductive plate disposed therein, a solid state oscillating element inserted into said resonant cavity, means for applying a bias voltage to said oscillating element, and a rod-shaped dielectric member having one end secured to an end wall of said cavity and the other end thereof supported extensibly within said cavity facing said oscillating element, a plurality of triangular projections of dielectric material provided on the surface of said rod-shaped dielectric member and contacting the side walls of said cavity so as to support said dielectric member, said movable conductive plate being fixed directly to said other end of said dielectric member in spaced relationship to the walls of said cavity.

5. A temperature compensated cavity resonator for a solid state oscillator as defined in claim 4, in which the width of said movable conductive plate is more than one-third the width of the cavity portion of said resonant cavity.

6. A temperature compensated cavity resonator for a solid state oscillator as defined in claim 5, in which the length of said movable conductive plate is $\lambda_g/4$ in the axial direction of said cavity resonator, where $\lambda_g$ is the wavelength of the cavity, and the length from the surface of said movable conductive plate facing the cavity portion to the secured end of said rod-shaped dielectric member is $\lambda_g/4 + \lambda_g 4\sqrt{\epsilon}$, where $\epsilon$ is the dielectric constant of the rod-shaped dielectric member.

7. A temperature compensated cavity resonator for a solid state oscillator as defined in claim 6, wherein said triangular projections are formed as an integral part of said dielectric member.

8. A temperature compensated cavity resonator for a solid state oscillator as defined in claim 7, wherein said triangular projections are formed as longitudinal ribs on said dielectric member.

* * * * *